United States Patent [19]

Schaeffer et al.

[11] Patent Number: 4,747,209
[45] Date of Patent: May 31, 1988

[54] CONTACT ALIGNMENT TOOL

[75] Inventors: Richard L. Schaeffer, Carlisle; Robert Volinskie, Hershey; Robert L. Bendorf, Lemoyne; Scott A. Keener, Annville, all of Pa.

[73] Assignee: AMP Incorporated, Harrisburg, Pa.

[21] Appl. No.: 20,001

[22] Filed: Feb. 27, 1987

Related U.S. Application Data

[63] Continuation-in-part of Ser. No. 887,665, Jul. 17, 1986.

[51] Int. Cl.$^4$ ............................................. H05K 13/04
[52] U.S. Cl. ........................................ 29/741; 29/758; 29/764
[58] Field of Search ................. 29/739, 741, 750, 751, 29/758, 764, 759

[56] References Cited

U.S. PATENT DOCUMENTS

| | | | |
|---|---|---|---|
| 3,443,297 | 5/1969 | Lusby, Jr. | 29/764 |
| 3,538,580 | 11/1970 | Bruner | 29/203 |
| 4,141,138 | 2/1979 | Quick | 29/758 X |
| 4,152,827 | 5/1979 | Walton, II. | 29/764 |
| 4,521,959 | 6/1985 | Sprenkle | 29/741 |
| 4,583,287 | 4/1986 | McDevitt et al. | 29/758 X |

Primary Examiner—Timothy V. Eley
Attorney, Agent, or Firm—Bruce J. Wolstoncroft

[57] ABSTRACT

A tool for aligning contacts of an electrical connector with conductive areas of a circuit board comprises a base member with comb means movably secured thereto. The comb means are movable between a first position and a second position to cooperate with the contacts of the connector to insure that the contacts are precisely aligned as the circuit board is inserted into the connector. Securing and alignment means are provided to allow the comb means to easily adjust to the contacts of individual connectors. As the comb means is brought into engagement with the contacts a space bar is provided to prevent the contacts from entering the recess into which the circuit board enters. The contacts are maintained in position as soldering occurs, ensuring that a positive electrical connection is affected.

17 Claims, 8 Drawing Sheets

CONTACT ALIGNMENT TOOL

RELATIONSHIP TO OTHER COPENDING APPLICATIONS

This application is a continuation-in-part of U.S. application Ser. No. 887,665 filed July 17, 1986.

FIELD OF THE INVENTION

This invention relates to an alignment tool for proper placement of an electrical connector on an edge of a printed circuit, and in particular, to a tool for alignment of electrical contacts of the connector with leads or pads on the printed circuit board.

Further, this invention relates to a tool which maintains a proper and accurate relationship of the contacts with the printed circuit board leads or pads so as to obtain highly reliable and trouble-free connections.

BACKGROUND OF THE INVENTION

An increasingly higher density connections are needed for circuit boards which have extremely high component packing density, the requirements for connectors, which cooperate with the boards, have become more severe and harder to meet. This is particularly true with edge connectors. After the circuit board has had all of the components placed on the surface thereof, the placement of the edge connector has become a critical feature in the method of circuit board fabrication.

The connector must have its electrical contacts connected to each of a number of circuit board leads or printed circuit pads. Once the connections are made, soldering occurs to assure that a reliable electrical connection is maintained. Consequently, if the initial connection between the board and the connector is faulty, the soldering will only serve to preserve this flawed connection. Therefore, a premium is placed on the initial connection between the board and the connector.

Because of the high packing density, the leads on the circuit board must be placed around the periphery thereof, and especially along one of the edges so that the component packing density may further be improved for the printed circuit board. These boards are used in an appropriate device such as a computer. The component packing density requires high connection density. Hence, connection density has fairly severe demands, such that problems have been encountered by the mere placement of the connector on an edge of a printed circuit board. For example, contacts have to be spaced at a spacing of about 0.050 inches center line to center line. These spacings have not been sufficient, and further density of these contacts has been obtained by placing two rows of contact in line, one over the other, each making a connection to a different printed circuit board lead or pad; a contact lead width of less than 0.020 inches has been used for the above 0.050 center line to center line connectors. Another method of obtaining the density requirement is to provide the leads or pads of the circuit board closer together, requiring a connector which has contacts which are able to be placed at a closer center line spacing.

A problem that arises with these high density connectors is that the contacts are fragile and therefore, easily damaged. Various attempts have been made to insure contact integrity, but great difficulties have arisen by the mere mechanical placement of the connector contacts on the printed circuit boards. These rather fragile and easily distortable contacts have tended to be easily damaged, and although various aids have been used, such as plastic insertion sheets to help avoid damage, the individual contacts have still been misplaced and/or have warped during soldering. While a number of attempts have been made to assure proper placement of the connector on the printed circuit board contacts after the placement of the connector has been achieved, the proper alignment has often been lacking, causing a number of reliability problems. These problems are magnified when one considers that when one contact is not functioning, because of misalignment, etc., the entire connector can be effectively useless. Consequently, contact integrity and reliability are severe problems in the assembly of circuit boards for which a series of solutions have been offered, none of which has been satisfactory.

SUMMARY OF THE INVENTION

The tool of the present invention eliminates and/or minimizes a number of problems encountered with the prior art, thereby providing a much more reliable electrical connection between the connector and the board. As a result of the present invention, the placement of the connector on the printed circuit board has been improved. The reflow solder process has also been enhanced, as the contacts are no longer susceptible to warpage. This accurate placement, as a result of the utilization of comb means placed on an alignment tool has increased the reliability and contact integrity during solder reflow to such a degree that the results have been outstanding and significant in terms of the prior art devices and methods which heretofore have been employed.

Still further, a novel method has been discovered which provides such easy insertion of the connectors on an edge of a printed circuit board as part of an overall solder reflow process that the reliability and reject rate can be minimized to such a substantial degree such that the loss associated with rejects has been substantially eliminated.

According to the present invention, a tool for aligning contacts of an electrical connector with conductive areas of a circuit board comprises a support means which has a connector recess located adjacent a top surface thereof. The connector receiving recess cooperates with the connector to accurately locate and maintain the connector in the tool.

An alignment means is movably mounted to the support means, such that the alignment means is movable between a first and a second position. Comb means are provided at a free end of the alignment means, such that the comb means may cooperate with contacts of the connector when the alignment means is in the second position. Adjustment means are also provided to cooperate with the support means and alignment means. The adjustment means allows the comb means to be accurately aligned with the contacts of the connector when the alignment means is in the second position, thereby insuring that the comb means will properly support the contacts of the connector when the printed circuit board is inserted between the contacts.

DETAILED DESCRIPTION OF THE INVENTION

Figure 1:
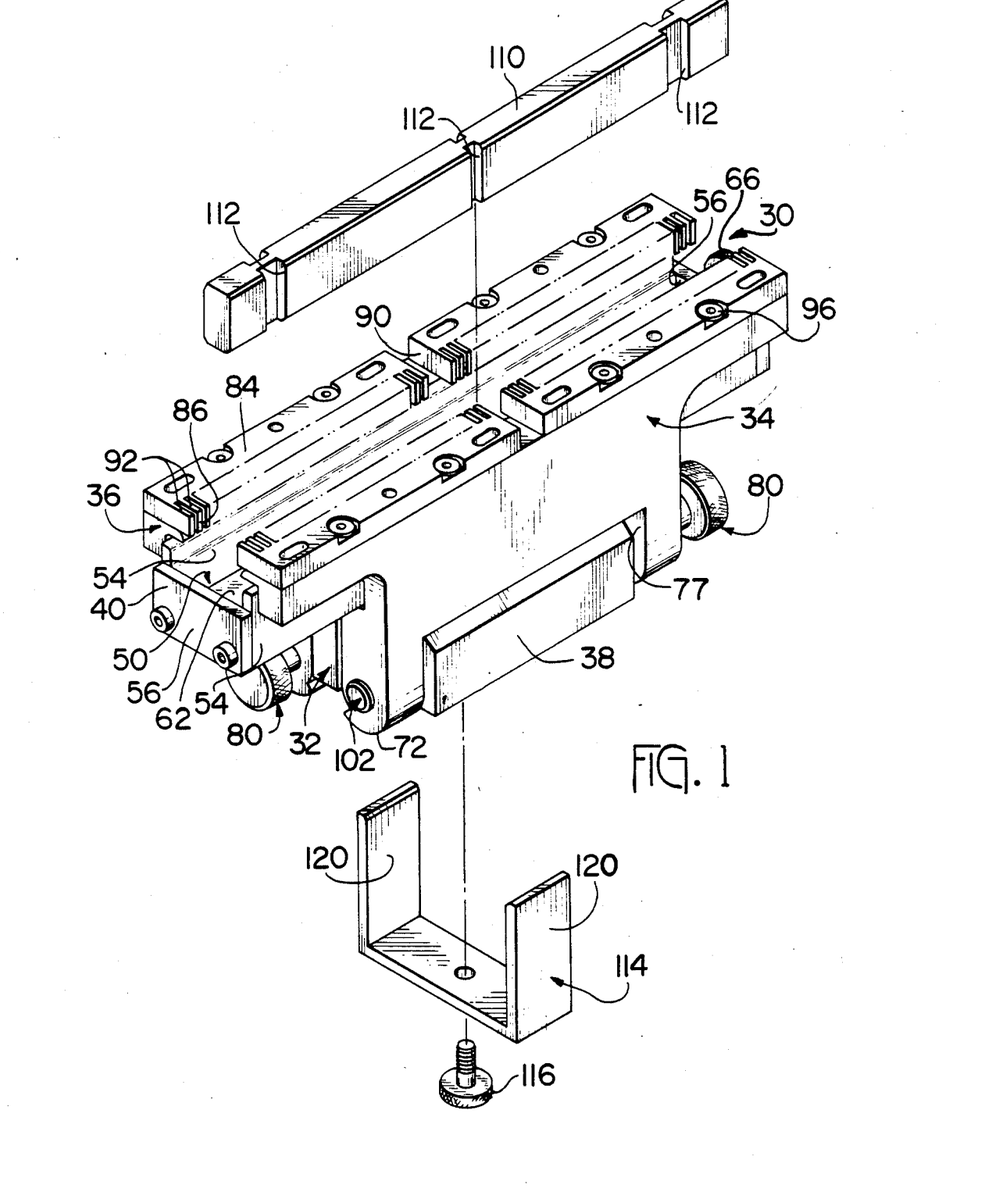
FIG. 1 is an exploded perspective view of an alignment tool of the present invention shown in the closed position with a support bar and a securing clamp exploded therefrom, the connector has been omitted from the connector receiving area to allow for a detailed showing of the tool.

FIG. 1 shows a tool 30 of the present invention with a space bar 110 and clamp 114 exploded therefrom. Tool 30 is shown in a closed position but with no connector 2 positioned therein. In use, tool 30 would have connector 2 positioned in a connector receiving recess 50 such that combs 86 would align and support upper sections 20 of contacts 6, which extend from connector 2 (FIG. 15), when connector 2 is terminated to a printed circuit board 22.

Figure 17:
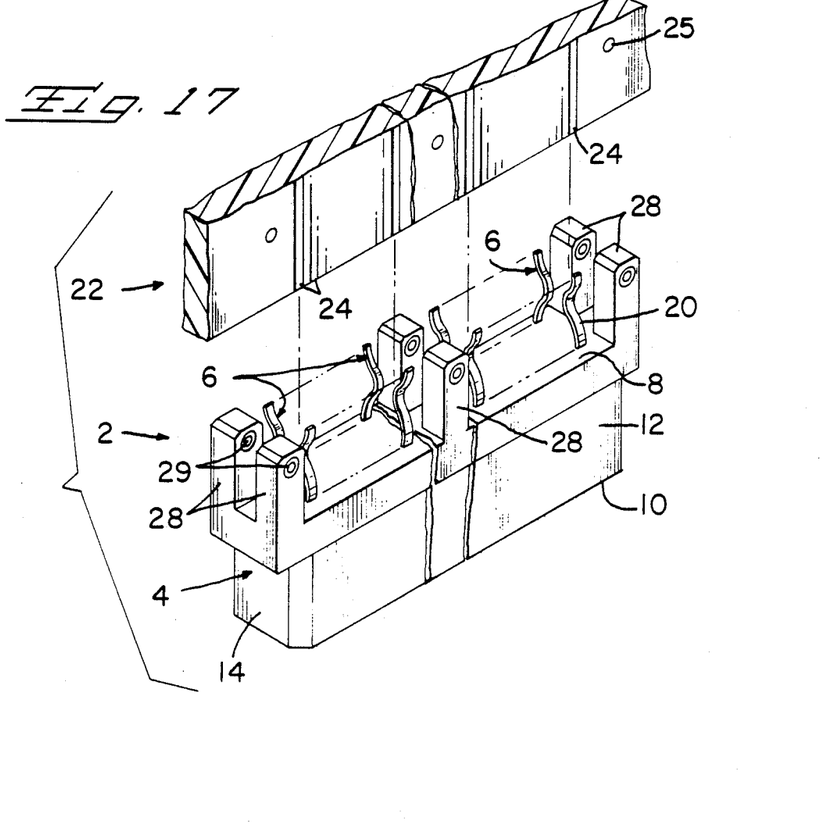
FIG. 17 is a perspective view of a connector which can be used in the tool.

Before explaining tool 30 in detail, connector 2 which can be used in tool 30 will be described. FIG. 17 shows an example of the type of connector 2 for which tool 30 is to be used. Connector 2 has a dielectric housing 4 with electrical contacts 6 extending therethrough. Contacts 6 are equally spaced along the entire length of connector 2. Housing 4 is of a generally rectangular shape having a top surface 8 and a bottom surface 10, with side walls 12 and end walls 14 extending therebetween. Connector 2 has some type of keying system located therein which cooperates with tool 30 to accurately position connector 2 in tool 30, as will be discussed. Positioned on both sides of connector 2, proximate side walls 12, are contacts 6. Extending from top surface 8 of housing 4 and away from housing 4 are upper sections 20 of contacts 6. As a circuit board 22 is inserted between contacts 6, upper sections 20 cooperate with conductive areas or pads 24 on circuit board 22 to provide electrical connection between contacts 6 of connector 2 and conductive areas 24 of circuit board 22. Mounting legs 28 extend from top surface 8 in the same direction as upper portions 20 of contacts 6. Mounting legs 28 are periodically spaced, and extend beyond the ends of upper portions 20, such that mounting legs 28 prevent upper portions 20 from being harmed during transportation, etc. Mounting legs 28 have openings 28 extending therethrough. Openings 29 align with openings 25 of circuit board 22, such that mounting hardware (not shown) may be inserted through openings 25 and 29 to maintain connector 2 in electrical engagement with board 22. It should be noted that the connector shown and described is but one of many connectors which can be used in conjunction with tool 30.

Figure 5:
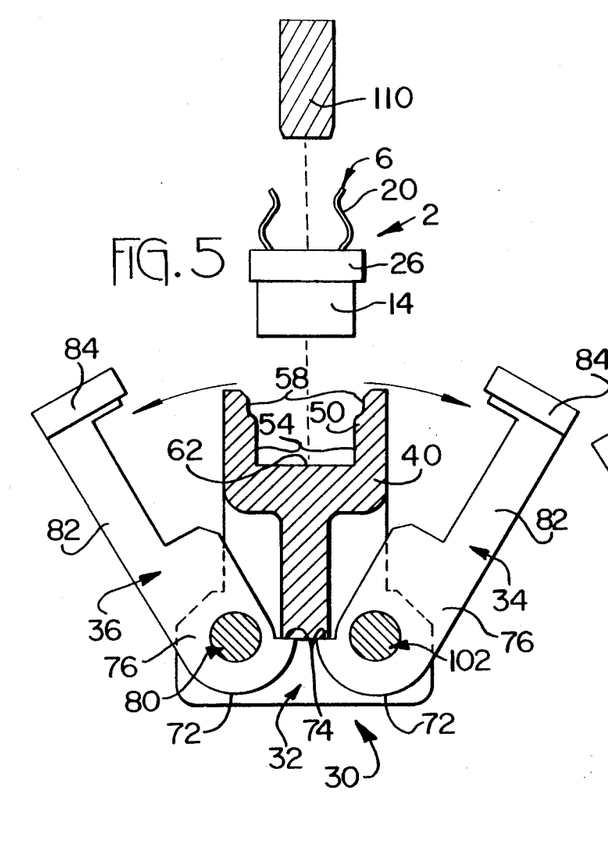
FIG. 5 is an end-elevational view of the tool in an open position with the connector and the support bar exploded therefrom.

Referring to FIGS. 1 and 5, tool 30 is comprised of a support member 32 and two alignment members 34, 36 pivotally mounted to support member 32. Support member 32 is comprised of two sections; a first or alignment member cooperation section 38, and a second or connector cooperation section 40. As can be seen from the cross-sectional views of tool 30 (FIG. 5), first section 38 has a wide base with openings 44 (FIG. 3) positioned therein. Openings 44 extend through the entire length of the base of first section 38, allowing openings 44 to cooperate with securing means to secure alignment members 34, 36 to the support member 32, as will be discussed. A top portion of first section 38 narrows and is connected to second section 40. Second section 40 in generally Y-shaped and has a connector receiving recess 50 positioned therein. Connector receiving recess 50 extends from a top surface of second section 40 inward as shown in FIG. 5. The dimensions of connector receiving recess 50 can vary according to the dimensions of connectors 2 to be used in tool 30.

Referring to FIG. 1, connector receiving recess 50 has side walls 54 and end walls 56. Side walls 54 are configured to receive connector 2 therein, consequently, the configuration of connector receiving recess 50 may vary according the type of connector 2 used. As best shown in FIG. 5, connector receiving recess 50 has side walls 54 with recesses 58 provided therein. Recesses 58 cooperate with projections 26 of side walls 12 of connector 2. End walls 56 of recess 50 have identical recesses provided therein to cooperate with the projections of endwalls 14 of connector 2. Side walls 54 and end walls 56 cooperate to properly position and maintain connector 2 in connector receiving recess 50. To ensure that connector 2 is properly positioned, any number of keying systems can be used in connector receiving recess 50. One such keying system (not shown), which is well known in the industry, is to have one or more corners of a bottom surface 62 of connector receiving recess raised to correspond to cavities placed in the corners of bottom surface 10 of housing 4 of connector 2. This configuration causes the recesses in bottom surface 10 of connector 2 to align with the raised corners of connector receiving recess 50 in order for connector 2 to be properly positioned in connector receiving recess 50. Keying is essential to align upper sections 20 of contacts 2 in the proper position, as will be discussed. An alternative keying system (not shown) has a raised area on bottom surface 62 of connector receiving recess 50. The raised area corresponds to a channel located in bottom surface 10 of connector 2. As connector 2 is placed in connector receiving recess 50, the channel must align with the raised area in order to effect proper insertion of connector 2 in connector receiving recess 50. This alternative keying system also has the advantage, in some instances, of eliminating the need for end walls 56 of connector receiving recess 50. The combination of the raised area cooperating with the channel, and side walls 54 of connector receiving recess 50 cooperating with side walls 12 of housing 4 of connector 2 maintains connector 2 in connector receiving recess 50 and thus, eliminates the need for end walls 56. This allows one tool 30 to accommodate many sizes of connectors 2. In some instance end walls are essential, no matter the keying system used. It should be noted that the keying systems described are only exemplary and are not meant to limit the scope of the invention.

Figures 2, 3, 4:
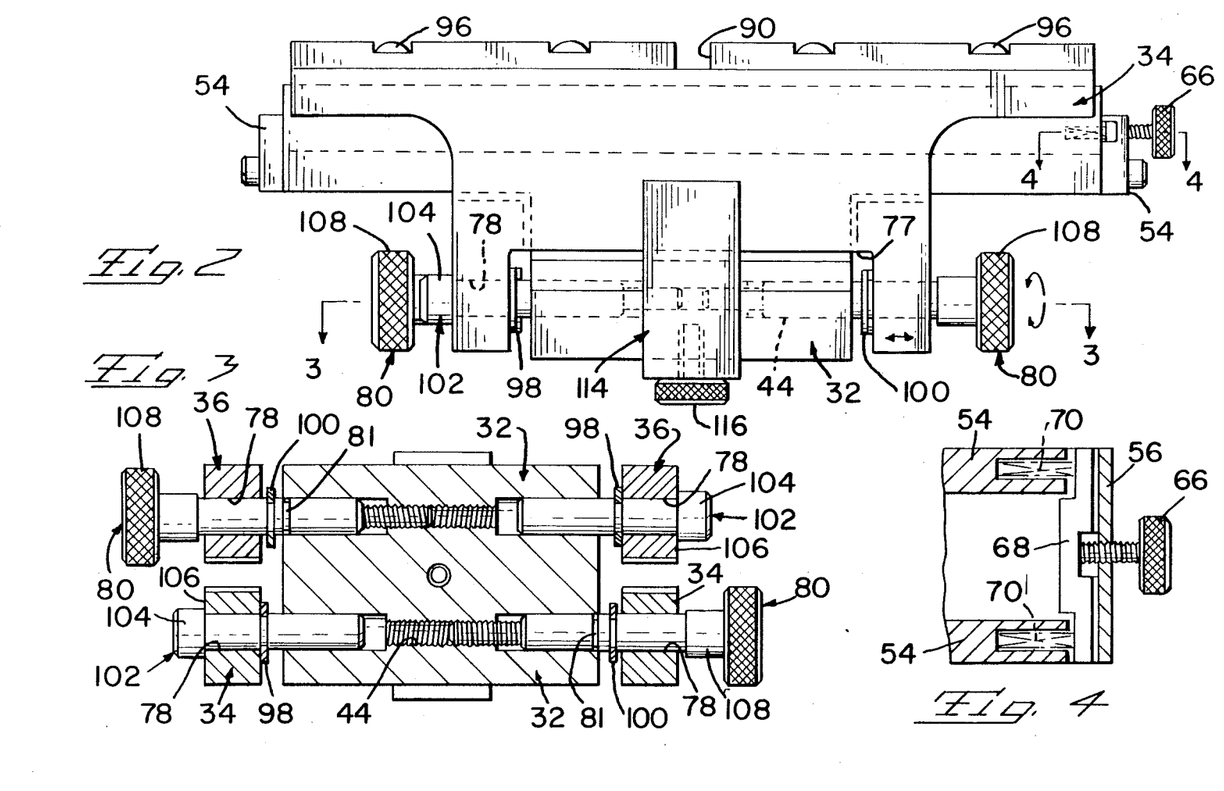
FIG. 2 is an elevational view of the tool with the securing clamp in position thereon.
FIG. 3 is a cross sectional view, taken along line 3—3 of FIG. 2, showing adjustment means for alignment means of the tool.
FIG. 4 is a cross sectional view, taken along line 4—4 of FIG. 2, showing locking means which lock the connector in the connector receiving area.

Referring to FIG. 4, end wall 56 of connector receiving recess 50 has a screw 66 extending outwardly therefrom. Screw 66 cooperates with a movable inside portion 68 of end wall 56. Also cooperating with inside portion 68 are springs 70 which extend into side walls 54. A respective spring 70 is positioned on each side of movable inside portion 68 of end wall 56. This configuration allows screw 66 to be tightened after connector 2 has been inserted into connector receiving recess 50. As screw 66 is tightened, inside portion 68 of end wall 56 moves inward, engaging connector 2, causing connector 2 to be secured between end wall 56 opposite inside portion 68 and inside portion 68. As this occurs, springs 70 are forced to compress, thereby exerting a force on inside portion 68. To release connector 2, screw 66 is loosened, allowing springs 70 to force inside portion 68 of end wall 56 outward, away from connector 2, thereby releasing connector 2, allowing connector 2 to be removed from connector receiving recess 50. Screw 66, inside portion 68, and springs 70 need be provided at only one end of tool 30, as is shown in FIG. 4, as the force required to maintain connector 2 is minimal, and can be supplied from one end.

As previously stated, support member 32 has alignment members 34, 36 pivotally mounted thereto. Alignment members 34, 36 are positioned on opposite sides of support member 32, as shown in FIG. 5. For ease of explanation, only one alignment member 34 will be described in detail. The other alignment member 36 is identical to alignment member 34 described, and therefore, the same numerals will be used for the identical features present on each.

Alignment member 34, as is shown in FIGS. 1 and 5 through 13, has an arcuate shaped bottom surface 72. A shoulder 74 is provided at one end of bottom surface 72, shoulder 74 cooperates with second section 40 of support member 32, as will be discussed. A support section 76 is provided above bottom surface 72. Support section 76 has a recess 77 which extends from surface 72 upward, as shown in FIG. 1. On either side of recess 77 are openings 78 (best shown in FIG. 3) which extend through support section 76. Openings 78 cooperate with the securing means, of which a support screw 80 is part. This configuration of alignment member 34 is such that the outside surface is essentially flat, while the inside surfaces conforms to the shape of second section 40.

Figure 8:
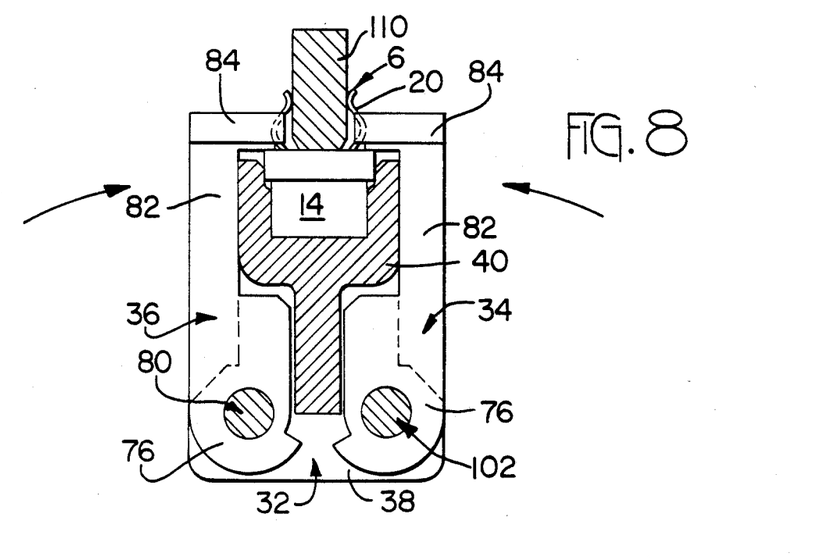
FIG. 8 is an end-elevational view of the tool in a closed position with the connector and the support bar inserted therein.

Consequently, when alignment members 34, 36 are in the closed position, tool 30 is essentially in the shape of a rectangular box when viewed from the side, as in FIG. 8.

Extending upward from support section 76 is a narrow neck section 82. Extending from neck section 82, at the opposite end from support section 76, is comb section 84. Comb section 84 cooperates with upper sections 20 of contacts 6 of connector 2, as will be discussed. Comb section 84 (FIG. 1) is comprised of combs 86 which are mounted thereon. Individual sections of combs 86 have been designated by breakpoints 90. Breakpoints 90 cooperate with connector 2 to provide the clearance required for mounting legs 28 of connector 2. Each of combs 86 is secured to comb section 84 by bolts 96.

Alignment member 34 is pivotally mounted to support member 32 by the securing means, as shown in FIG. 3. The securing means comprises screw 80, two retention rings 98, 100, and a slide member 102. To assemble alignment member 34 to support member 32, the following steps must be taken. Slide member 102 is placed through opening 78 in alignment member 34 until head 104 of slide member 102 contacts a surface 106 of alignment member 34, as shown in FIG. 3. Retaining ring 98 is then placed on slide member 102 to retain slide member 102 in opening 78. Retaining ring 98 and head 104 of slide member 102 are positioned such that alignment member 34 can only pivot about slide member 102, alignment member 34 cannot move in the direction of the axis of slide member 102. Slide member 102 is then positioned in opening 44 of support memeber 32. Slide member 102 has no threads and is dimensioned to allow it to move freely along the axis of opening 44. With slide member 102 positioned in opening 44 of support member 32, screw 80 is inserted through opening 78 of alignment member 34 and secured into opening 44 of support member 32. Screw 80 is provided with a groove 81, such that screw 80 is properly positioned when groove 81 can no longer be seen. In other words, as screw 80 is tightened, groove 81 will disappear into support member 32. Just as this occurs, screw 80 is properly positioned. Retaining ring 100 is then installed on screw 80 to maintain alignment member 34 between head 108 of screw 80 and retention ring 100. However, retention ring 100 is positioned on screw 80 in a manner which allows alignment member 34 to move relative to the axis of screw 80. This movement allows combs 86 to be correctly positioned relative to upper sections 20 of contacts 6 of connector 2, as will be discussed.

A space bar 110, FIGS. 1 and 5 through 8, is provided to cooperate with upper sections 20 of contacts 6 to ensure that contacts 6 are supported as combs 86 are brought into engagement therewith, as will be discussed. Space bar 110 is a long, thin piece of metal which has recesses 112 spaced therein. Recesses 112 align with mounting legs 15 of connector 2. Recesses 112 and mounting legs 15 are dimensioned such that space bar 110 will be maintained in the proper position. The length of space bar 110 corresponds to the length of connector 2 being used. The width of space bar 110 is such to allow space bar 110 to be inserted between contacts 6 of connector 2, while allowing space bar 110 to perform its function of protecting contacts 6 from overbending as combs 86 are brought into engagement therewith.

Figure 9:
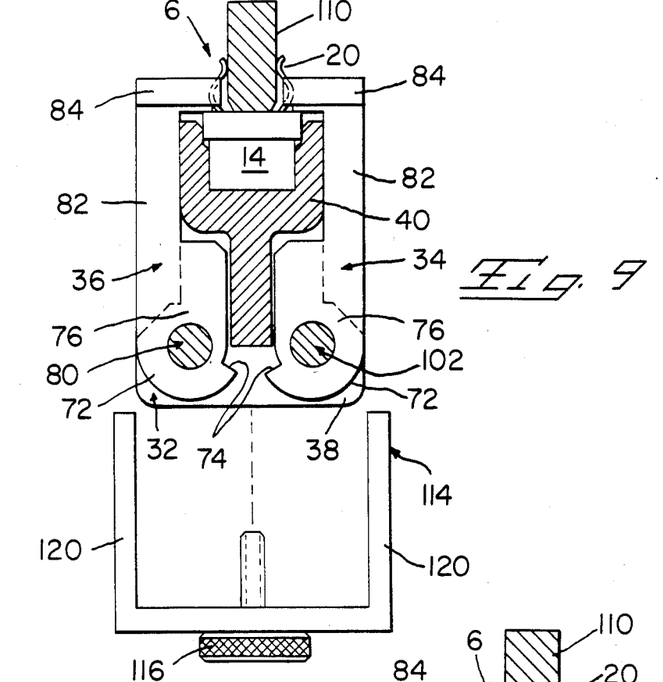
FIG. 9 is a view similar to FIG. 8 showing the securing clamp in a position to be inserted onto the tool.
Figure 10:
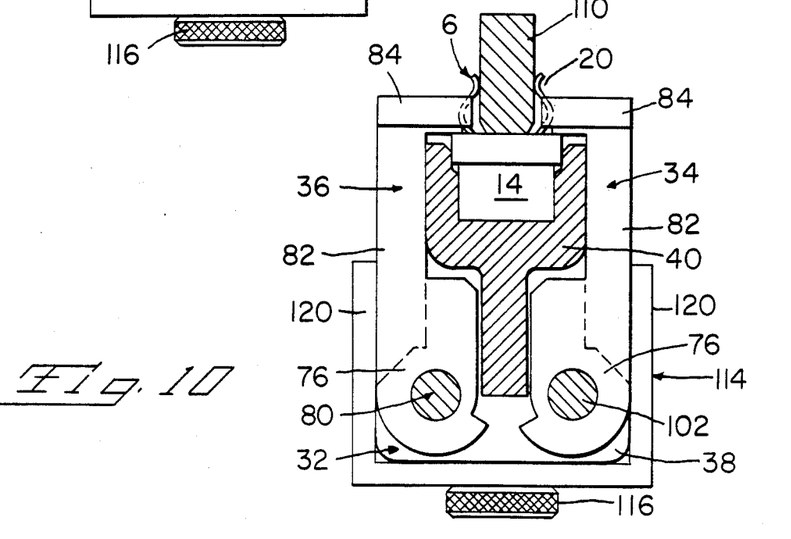
FIG. 10 is a view similar to FIG. 9 showing the securing clamp inserted onto the tool to maintain the tool in the closed position.

A U-shaped clamp 114, FIGS. 1, 9, and 10, is provided to maintain alignment members 34, 36 in the closed position as the other operations are taking place. Clamp 114 is inserted over alignment members 34, 36 and maintained in that position by screw 116 which cooperates with a hole of support member 32. This ensures that combs 86 are maintained in proper position with respect to contacts 6 of connector 2 as circuit board 22 is moved into position, as will be discussed.

Figure 6:
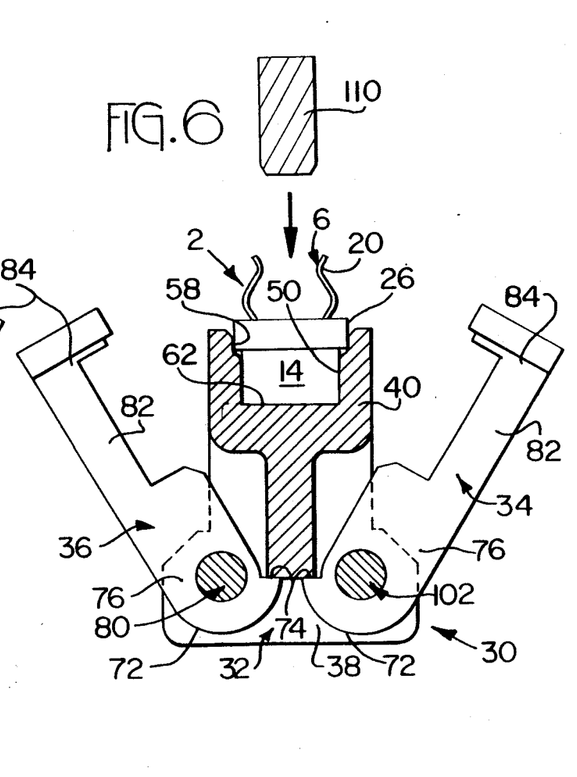
FIG. 6 is a view similar to that of FIG. 5 with the connector in the connector receiving area of the tool.

In assembly cross-sectional views, FIGS. 5 through 14, the sequence of the steps followed is depicted. FIG. 5 shows tool 30 with alignment members 34, 36 in the open position. Shoulders 74 engage a surface of support member 32 defining a stop position which is the open position of alignment members 34, 36. Connector 2 and space bar 110 are positioned above connector receiving recess 50 in preparation for insertion therein. Connector 2 is then inserted into recess 50 as shown in FIG. 6. As previously discussed, connector 2 is properly positioned in recess 50 through the use of a kyeing system. Screw 66 is tightened, thereby securing connector 2 in recess 50.

Figure 7:
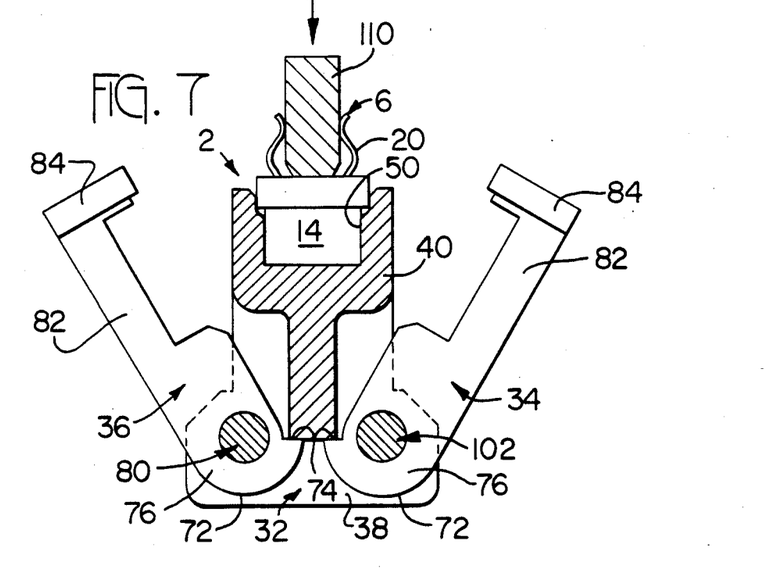
FIG. 7 is a view similar to that of FIG. 5 with the connector inserted into the connector receiving area and the support bar inserted between rows of contacts of the connector.

With connector 2 secured in recess 50, space bar 110 is inserted between contacts 6, as shown in FIG. 7. The presence of space bar 110 in recess 50 allows alignment members 34, 36 to be brought to the closed position, as shown in FIG. 8, without damaging fragile upper sections 20 of contacts 6. In other words, as alignment members 34, 36 are closed, combs 86 engage upper sections 20 of contacts 6. Each alignment member 34, 36 has been aligned through the use of screw 80 to position combs 86 in proper alignment with upper portions 20 of contacts 6. As screw 80 is turned, each alignment member 34, 36 must move accordingly. This causes combs 86 to be generally aligned with contacts 6 of connector 2. However, no contact 6 of various connectors 2 are identically positioned. In order to accommodate this misalignment, screw 80, retention rings 98, 100, and slide member 102 allow alignment members 34, 36 to be moved a minimal amount with respect to contacts 6. The loose fit of retention ring 100 with respect to alignment members 34, 36 and the freedom of slide 102, allows alignment member to move a minimal amount along the axis of screw 80. This added movement is to ensure that combs 86 are properly aligned with contacts 6. This is an important feature because through manufacturing tolerances and the like, each connector 2 aligns slightly differently than the previous connector. It is therefore essential that alignment members 34, 36 have a small amount of freedom as they are closed to insure that teeth 92 of combs 86 are positioned in the spaces between contacts 6 for each individual connector 2.

Due to the manufacturing tolerances, bending during transportation, etc. it is unlikely that contacts 6 will maintain their proper nominal spacing. Therefore, teeth 92 of combs 86 are designed to allow these offset contacts 6 to be positioned therebetween. The positioning of the contacts between teeth 92 is insured as space bar 110 prevents contacts 6 from being deformed toward the center of recess 50. Bent contacts 6 engage space bar 110 preventing them from moving toward the center of recess 50. At this occurs, alignment members 34, 36 continue to move to the closed position. Consequently, the only place for bent contacts 6 to move to is the opening between teeth 92 of combs 86. Space bar 110 prevents contacts 6 from moving into recess 50 and cooperates with combs 86 to provide an alignment feature for contacts 6 that have been manufactured poorly or that have been bent during shipping, etc. This ensures that the insertion of circuit board 22 into recess 18 will occur smoothly and without damage to upper sections 20 of contacts 6.

With alignment members 34, 36 in the closed position, clamp 114 is brought into engagement with the outside surfaces of tool 30, as shown in FIG. 10. Upright arms 120 of U-shaped clamp 114 cooperate with alignment members 34, 36 to maintain them in the closed position, thereby insuring that combs 86 are properly maintained in alignment with contacts 6 of connector 2. Clamp 114 is secured to tool 30 by screw 116 which cooperates with the hole provided in support member 32.

Figure 11:
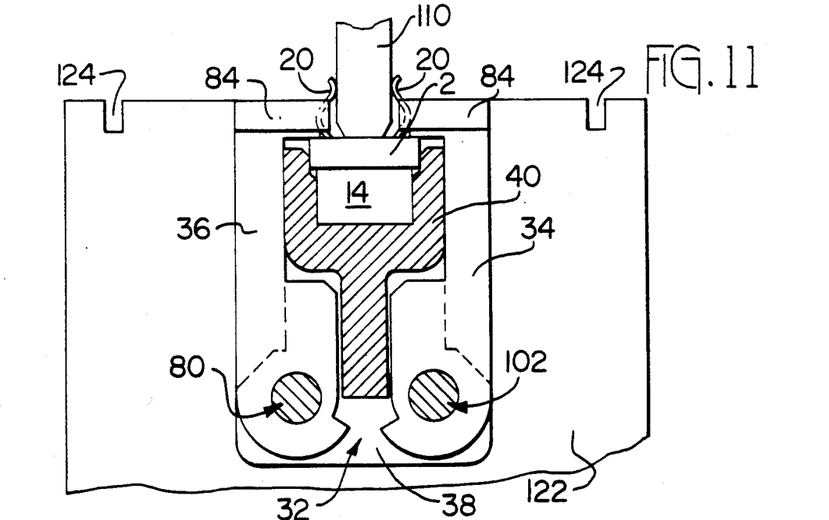
FIG. 11 is an end-elevational view of the tool, shown in FIG. 10, inserted in a fixture and secured therein.

With clamp 114 secured, tool 30 is positioned in fixture 122, as shown in FIG. 11. Space bar 110 is then removed from between contacts 6, allowing circuit board 22 to be positioned therein.

Figure 12:
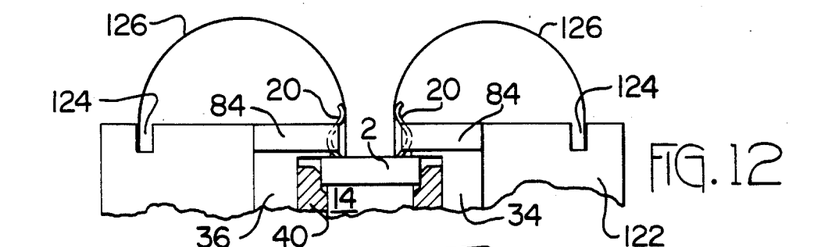
FIG. 12 is a view similar to that of FIG. 11, showing the space bar removed and a transparent film inserted between the rows of contacts.
Figure 13:
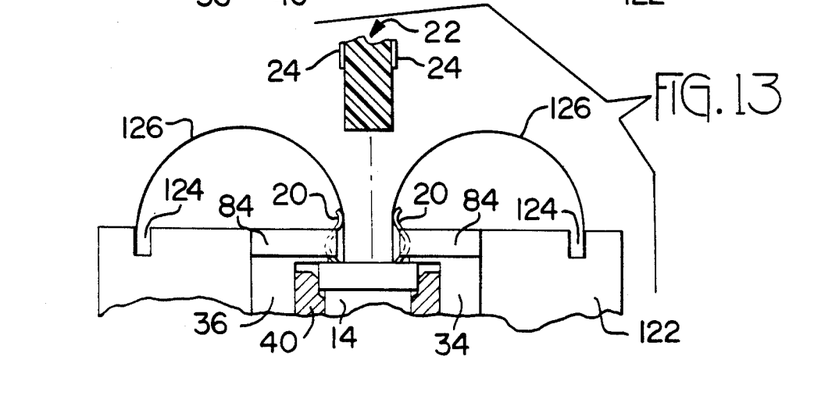
FIG. 13 is an end-elevational view of the tool, similar to that of FIG. 12, with a printed circuit board positioned for insertion between the rows of contacts of the connector.
Figure 14:
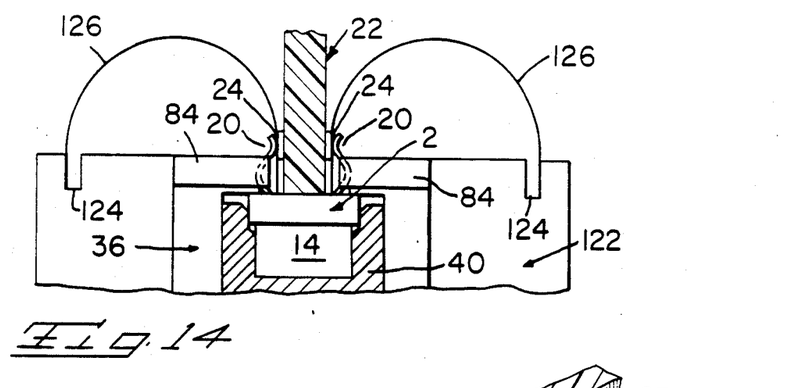
FIG. 14 is a view similar to that of FIG. 13 showing the printed circuit board inserted between the rows of contacts of the connector.

In order to facilitate insertion of printed circuit board 22 between contacts 6 without damaging them, fixture 122, shown in FIG. 12, is used to receive in recesses 124 thereof ends of thin transparent plastic sheets 126 which are then inserted between row of contacts 6 of connector 2. This arrangement facilitates the insertion of printed circuit board 22 between contacts 6 as shown in FIGS. 13 and 14, and places in a proper position connector 2 on circuit board 22 vis-a-vis its reference holes and the like. Recesses 124 are not the only means which can be utilized to hold sheets 126 in place. Any type of clamp means, etc. can also be used.

The actual alignment of pads 24 with contacts 6 takes place prior to the removal of sheets 126. The adjustment is much more readily accomplished with sheets 126 in place because contacts 6 can easily be moved along sheets 126 rather than along circuit boards 22. The sheets used are transparent so that pads 24 can be readily observed as movement occurs.

Figures 15, 16:
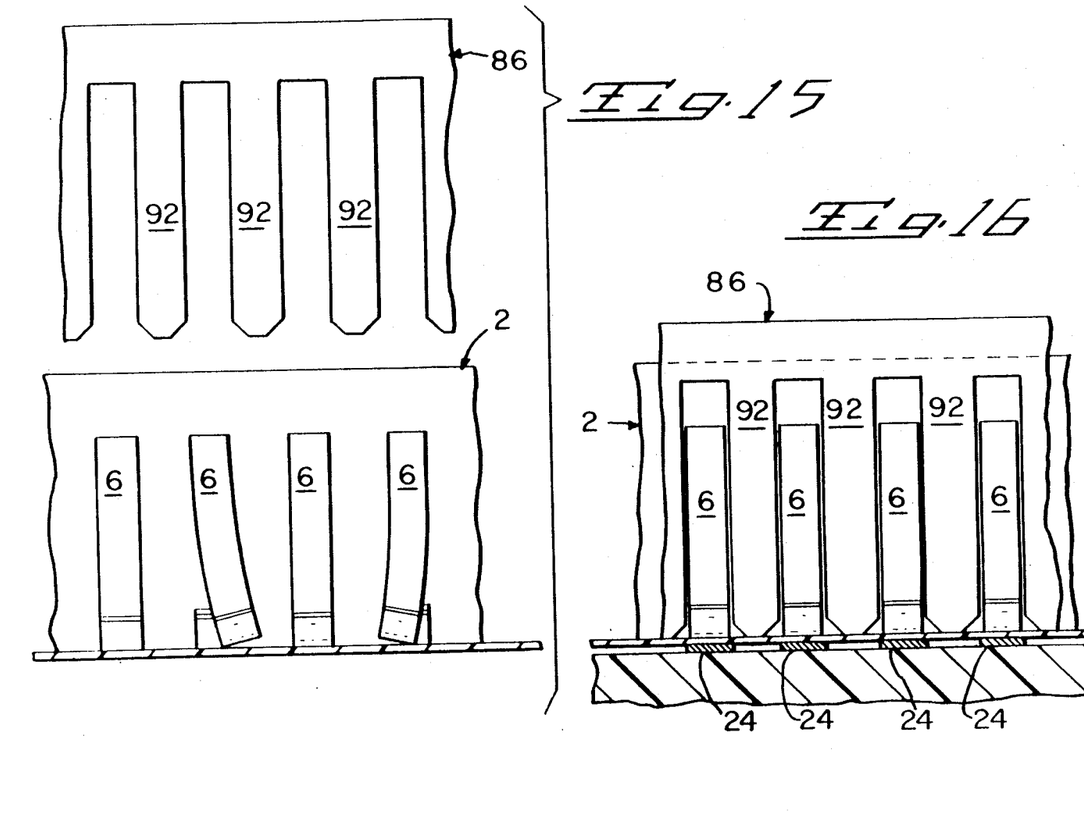
FIG. 15 illustrates schematically in an enlarged part view the alignment of the contacts before the tool is brought into engagement therewith.
FIG. 16 illustrates schematically in an enlarged part view the alignment of the contact after the tool has been brought into engagement therewith.

FIG. 15 is an appropriate illustration of the various positions of circuit board pads 24 vis-a-vis contacts 6 of connector 2 without the use of tool 30. Without combs 86 and comb teeth 92 to help, various misalignments are fairly evident. Even when sheets 126 are being used to accomplish insertion, without tool 30 between contacts 6 and pads 24, the alignment is not sufficient.

When tool 30 is secured to connector 2, comb teeth 92 will place contacts 6 on their proper centerlines. Contacts 6 are then moved such that contacts 6 align with pads 24, as shown in FIG. 16. The alignment achieved with contact alignment tool 30 is clearly evident.

As each of contacts 6 has a relative side play at the junction of contacts 6 with connector housing 4, the alignment can thus be readily fulfilled and made with great assurance with individual contacts 6, being properly and squarely placed on circuit board pads 24 for circuit board 22. After the above has been accomplished, sheets 126 are removed, and tool 30 is disengaged from fixture 122. Contacts 6 are then soldered to pads 24 to ensure a positive electrical connection. After soldering has occurred, tool 30 is removed from connector 2 by moving alignment members 34, 36 to the open position and turning screw 66 to release inner portion 68 of end wall 56 from connector 2.

As readily discerned from the above description, the invention herein allows a proper placement of high density in-line contacts of electrical connectors, either individually or in a engaged relationship on an edge of a printed circuit board. Such placement of connectors is readily accomplished and the necessary adjustments made before solder reflow. During solder reflow the tool is in place and maintains the contacts in a precise position relative to the solder pads to which the contacts are to be soldered. It is important that the comb mounting arm and the printed circuit board have nearly identical thermal coefficients of expansion to allow the proper alignment to be maintained during soldering.

High contact connection is thus assured. Hence, reliability of printed circuit boards is considerably improved. The reject rate for these boards is substantially reduced, if not eliminated by use of the present invention.

The presently disclosed tool may also be used for high density in-line contact connectors, that is, connectors with multiple rows of contacts where the connector leads are either on one or both sides of the printed circuit board.

It is also conceivable that the tool may be used to place a number of connectors on the edge of the printed circuit board at one time. This can be done with in-line as well as single line connectors.

Although further variations of the invention may be envisioned, such as where more than two leads are in a line, the present tool lends itself to the use of connectors with any contact lead arrangements. Nevertheless, it must be emphasized that with increased in-line contact and their density, problems arise which are necessarily more severe than when only two contacts are in line.

In addition to the description concerning the tool and the manner in which it is being used for applying a connector on a printed circuit board, it must be appreciated that the method of securing these connectors to the printed circuit board is a novel method in terms of the accomplishment of the adjustments and alignment. Consequently, all aspects of the disclosed invention are to be considered as part of this invention, and the scope of this invention is to be defined by the appended claims.

We claim:

1. A tool for aligning contacts of an electrical connector with conductive areas of a circuit board, comprising:
   support means having a connector receiving recess located adjacent a top surface thereof, the connector receiving recess cooperates with the connector to accurately locate and maintain the connector in the tool;
   alignment means movably mounted to the support means, the alignment means being movable between a first position and a second position;
   comb means provided at ends of the alignment means, the comb means positioned to cooperate with contacts of the connector when the alignment means is in the second position; and
   adjustment means which cooperate with the support means and the alignment means, the adjustment means being movable between a first aligned position and a second aligned position, such that as the adjustment means is moved, the alignment means is moved in a direction transverse to the path of motion of the alignment means as it is moved between the first and the second position, the movement of the adjustment means insures that the comb means of the alignment means is properly aligned with spaces between the contacts of the connector when the alignment means is placed in the second position, thereby insuring that the contacts are accurately located and maintained between the comb means as the circuit board is inserted into the electrical connector.

2. A tool as recited in claim 1 wherein the connector receiving recess has a keying arrangement.

3. A tool as recited in claim 2 wherein the keying arrangement is a raised bar on a bottom surface of the connector receiving recess.

4. A tool as recited in claim 1 wherein the connector receiving recess has locking means which cooperates with the connector to maintain the connector in the connector receiving recess.

5. A tool as recited in claim 4 wherein the locking means comprises a screw, a movable wall, and springs, such that as the screw is tightened, the wall is moved inward to engage a wall of the connector, thereby maintaining the connector in the connector receiving recess, and as the screw is loosened, the springs push the wall outwardly, causing the wall to disengage from the wall of the connector, thereby allowing the connector to be removed from the connector receiving recess.

6. A tool as recited in claim 1 wherein the alignment means have first stop surfaces and second stop surfaces which cooperate with corresponding surfaces on the support means to prevent the alignment means from moving past the first and the second position, respectively.

7. A tool as recited in claim 1 wherein clamp means are provided to maintain the alignment means in the second position as needed.

8. A tool as recited in claim 7 wherein the clamp means is comprised of a U shaped member which is placed over a bottom surface and side surfaces of the tool, such that the alignment means is maintained in the second position until the clamp means is removed.

9. A tool as recited in claim 1 wherein a space bar is provided, the space bar maintains contacts of connectors from being deformed as the comb means is moved into the second position.

10. A tool as recited in claim 1 wherein the alignment means has two identical members positioned on opposing sides of the support means.

11. A tool as recited in claim 1 wherein the support means and the alignment means have openings which extend therethrough, the openings of the alignment means align with the openings of the support means to provide openings which extend through the entire length of the tool.

12. A tool as recited in claim 11 wherein the adjustment means comprises a screw and a slide member which extend through the openings of the alignment means into the openings of the support means, the screw and slide means cooperate to securely mount the alignment means to the support means while still allowing the alignment means to be displaced in a small distance in the direction of the axis of the holes, allowing the alignment means to accurately align with each individual connector inserted into the connector receiving recess.

13. A tool for supporting and aligning contacts of an electrical connector with conductive areas positioned proximate an edge of a substrate, the tool comprising:
   a base member having a connector receiving recess extending from a top surface toward a bottom surface, the connector receiving recess extending essentially the entire length of the base member and dimensioned to receive the electrical connector therein, the base member having openings positioned proximate the recess, the openings extending the entire length of the base member;
comb means positioned adjacent the base member and movably attached thereto, the comb means having teeth provided at one end thereof;
projections provided on the comb means, the projections extend outward from an end of the comb means which is opposite the end which contains the teeth, the projections have openings provided therein, the openings align with a respective opening of the base member to provide a continuous passage therethrough;
securing means provided to cooperate with the openings of the base member and the comb means such that the securing means movably attaches the comb means to the base member; and
adjustment means provided to position the comb means in proper position with the connector, the adjustment means allows the teeth of the comb means to be precisely aligned.

14. A tool as recited in claim 13 wherein the adjustment means is located on the securing means.

15. A tool as recited in claim 14 wherein two comb means are movably mounted to the base means, a first comb means is provided proximate a side surface of base member, and a second comb means is provided proximate an opposed side surface of base member.

16. A tool as recited in claim 15 wherein each of the securing means and adjustment means comprises a screw and a slide member which cooperate with the openings of the base member and the comb means to secure the comb means to the base means.

17. A tool as recited in claim 16 wherein retention rings are provided on the screw and the slide member, the retention ring positioned on the slide member prevents the comb means from moving relative to the slide member in the direction of the longitudinal axis of the slide member, the retention ring positioned on the screw allows the comb means to move relative to the screw in one direction of the longitudinal axis of the screw, the configuration allowing the screw to be turned to position the comb means in general alignment with the connector while still allowing the comb means to be adjusted a small amount without the need to move the screw, thereby allowing for specific alignment of the comb means to each individual connector positioned in the connector receiving recess.

* * * * *